(12) United States Patent
Azimi et al.

(10) Patent No.: US 7,439,729 B2
(45) Date of Patent: Oct. 21, 2008

(54) INTEGRATED SYSTEMS TESTING

(75) Inventors: Saeed Azimi, Union City, CA (US); Son Ho, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 560 days.

(21) Appl. No.: 11/243,660

(22) Filed: Oct. 5, 2005

(65) Prior Publication Data

US 2007/0028143 A1 Feb. 1, 2007

Related U.S. Application Data

(63) Continuation of application No. 11/189,458, filed on Jul. 26, 2005, now Pat. No. 7,250,784.

(51) Int. Cl.
*G01R 31/28* (2006.01)
*G11B 27/36* (2006.01)
*G11B 20/00* (2006.01)
*G06F 11/00* (2006.01)

(52) U.S. Cl. ............... 324/158.1; 360/31; 369/53.1; 714/738

(58) Field of Classification Search ............ 360/31
See application file for complete search history.

(56) References Cited

U.S. PATENT DOCUMENTS

| 5,796,751 | A | 8/1998 | Kundu |
|---|---|---|---|
| 6,020,751 | A | 2/2000 | Rampone et al. |
| 6,775,091 | B1 | 8/2004 | Sutardja |
| 6,823,293 | B2 | 11/2004 | Chen et al. |
| 7,023,634 | B2 | 4/2006 | Takeo |
| 7,069,376 | B2 | 6/2006 | Mathewson et al. |
| 2005/0174678 | A1 | 8/2005 | Zayas et al. |
| 2005/0289262 | A1 | 12/2005 | Sutardja |
| 2006/0119963 | A1 | 6/2006 | Hidaka |

*Primary Examiner*—Ha Nguyen
*Assistant Examiner*—Roberto Velez

(57) ABSTRACT

A hard disk drive system comprises N hard disk drive means for performing hard disk drive functions and is connected in a daisy chain, wherein N is greater than one. The system includes integrated system test (IST) means for testing and that is integrated with a first one of the N hard disk drive means and includes pattern generating means for generating test pattern data and pattern monitoring means for receiving a returned test pattern. The pattern generating means generates test pattern data that is routed from the first one of the N hard disk drive means serially through the remaining ones of the N hard disk drive means and back to the first one of the N hard disk drive means. The pattern monitoring means generates test result data based on returned test data returned to the first one of the N hard disk drive means.

16 Claims, 7 Drawing Sheets

INTEGRATED SYSTEMS TESTING

CROSS REFERENCE TO RELATED APPLICATION

This application is a continuation of U.S. patent application Ser. No. 11/189,458, filed Jul. 26, 2005, which is incorporated herein by reference in its entirety.

FIELD OF THE INVENTION

The present invention relates to integrated systems testing, and more particularly to integrated hard disk drive systems testing.

BACKGROUND OF THE INVENTION

A system such as a hard disk drive (HDD) may include one or more chips and/or other components (chips/components) that are attached to a printed circuit board (PCB). Each of the chips/components on the PCB may interface with one or more other chips/components. The chips on the PCB may also interface with other chips and/or other components that are located off of the PCB. In addition, the chips/components on the PCB may also communicate with a host.

The PCB is designed to provide interconnections between the chips/components. As the number of chips/components and interconnections therebetween increases, the complexity of interconnecting traces on the PCB also usually increases. In some PCBs, multiple interconnect layers are required. For example, four layers are commonly required.

After assembling the chips and/or other components on the PCB, a probe card may be used to test connectivity therebetween. Typically, vias are formed in the PCB to allow the probe card to perform testing from a back side of the PCB. However, the vias increase the cost of manufacturing the PCB. After testing connectivity, the system is booted and firmware testing is performed. The results of the firmware testing are analyzed. If the system passes the testing, the PCB can be assembled on a HDD with a relatively high reliability.

To reduce the cost of manufacturing the PCB, the size of the PCB, the number of vias, and/or the number of interconnect layers must be reduced. The cost cutting design changes must be accomplished without decreasing reliability or reducing functionality.

SUMMARY OF THE INVENTION

A hard disk drive system includes an external interface that receives test configuration data, that transmits test result data, and that transmits and receives application data. The hard disk drive system includes a system on chip (SOC) that includes a controller and a read/write channel that communicates with the controller and that includes an integrated system test (IST) module that communicates with the external interface. A memory module communicates with the SOC and includes memory and an IST module. The hard disk drive system includes a spindle/voice coil motor driver module that includes an IST module. At least one of the IST modules is a master IST module that receives the test configuration data and that configures the IST modules for testing at least one of the controller, the read/write channel, and the memory module.

In other features, the testing includes loopback testing. The loopback testing can include test loops having different paths.

In other features, at least one of the IST modules includes a pattern generator that generates a predetermined pattern of test data. At least one of the IST modules can further include a pattern comparator that receives test data from at least one of the controller, read/write channel, and the memory module. The pattern comparator compares the data to the predetermined pattern of test data.

In other features, at least one of the IST modules includes a solder joint testing module. The solder joint testing module can include a pulse generator that applies a predetermined pulse to a pin of the SOC and a receiver that receives a resultant waveform from the pin. The solder joint testing module can include a comparator that compares a parameter of the resultant waveform to at least one predetermined parameter. The comparator can include a digital signal processor (DSP).

In other features, the hard disk drive system can include a printed circuit board (PCB), wherein the SOC, the memory module, and the spindle/voice coil motor driver module are mounted on the PCB. The hard disk drive system can include a spindle motor and a voice coil motor connected to the spindle/voice coil motor driver module.

In other features, the external interface can be of a type selected from a group consisting of integrated device electronics (IDE), fiber channel (FC), serial attached SCSI (SAS), secure digital input/output (SDIO), universal serial bus (USB), multimedia cards (MMC), high-speed multimedia cards (HS-MMC), advanced technology attachment (ATA), and serial Advanced Technology Attachment (SATA).

A method is provided for testing a hard disk drive system and includes receiving test configuration data, transmitting test result data, and transmitting and receiving application data through an external interface. The method also includes providing a system on chip (SOC) including a controller and a read/write channel, wherein the controller and the read/write channel include an integrated system test (IST) module. The method further includes providing a memory module that includes an IST module and providing a spindle/voice coil motor driver module that includes an IST module. At least one of the IST modules is a master IST module. The method also includes receiving the test configuration data at the master IST module and configuring the IST modules for testing at least one of the controller, the read/write channel, and the memory module based on the configuration data.

In other features, the testing includes loopback testing. The loopback testing can include test loops having different paths. The testing can include using at least one of the IST modules to generate a predetermined pattern of test data. The testing can include receiving test data from at least one of the controller, the read/write channel, and the memory module at least one of the IST modules; and comparing the test data to the predetermined pattern of test data.

In other features, the method includes applying a predetermined pulse from one of the IST modules to a pin of the SOC and the one of the IST modules receiving a resultant waveform from the pin. The method can include comparing a parameter of the resultant waveform to at least one predetermined parameter.

In other features, the method can include mounting the system on chip (SOC), the memory module, and the spindle/voice coil motor driver module to a printed circuit board (PCB). The method can also include providing a spindle motor and a voice coil motor; and connecting the spindle motor and the voice coil motor to the spindle/voice coil motor driver module.

A hard disk drive system is provided that includes an external interface means for receiving test configuration data, transmitting test result data, and transmitting and receiving application data. The hard disk drive system includes a system on chip (SOC) including controller means for communicating with the external interface means and read/write channel means for communicating with the controller means and that includes integrated system test (IST) means for testing. The hard disk drive system also includes memory means for communicating with the SOC means and that includes memory and IST means for testing. The hard disk drive system also includes spindle/voice coil motor driver means for moving associated components of the hard disk drive and that includes IST means for testing, wherein at least one of the IST means is master IST means for receiving the test configuration data and for configuring the IST means to test at least one of the controller means, the read/write channel means, and the memory means.

In other features, the testing includes loopback testing. The loopback testing can include test loops having different paths.

In other features, at least one of the IST means includes pattern generating means for generating a predetermined pattern of test data. The at least one of the IST means can further include pattern comparing means for receiving test data from at least one of the controller means, read/write channel means, and the memory means and for comparing the data to the predetermined pattern of test data.

In other features, at least one of the IST means includes solder joint testing means for testing a solder joint of the SOC. The solder joint testing means can include pulse generating means for applying a predetermined pulse to the solder joint of the SOC means. The solder joint test means can also include receiving means for receiving a resultant waveform from the solder joint. The solder joint testing means can include comparator means for comparing a parameter of the resultant waveform to at least one predetermined parameter. The comparator means can include a digital signal processor (DSP).

In other features, the external interface means can be of a type selected from a group consisting of integrated device electronics (IDE), fiber channel (FC), serial attached SCSI (SAS), secure digital input/output (SDIO), universal serial bus (USB), multimedia cards (MMC), high-speed multimedia cards (HS-MMC), advanced technology attachment (ATA), and serial Advanced Technology Attachment (SATA).

In other features, the hard disk drive system further includes circuit board means for mounting and connecting the SOC means, the memory module means, and the spindle/voice coil motor driver module means. The hard disk drive system can also include a spindle motor means for rotating a first component of a disk drive and that connect to said spindle/voice coil motor driver means, and voice coil motor means for moving a second component of said disk drive and that connect to the spindle/voice coil motor driver means.

A system on chip (SOC) is provided having an external interface that receives test configuration data, that transmits test result data, and that transmits and receives application data; and a plurality of SOC components, each including an integrated system test (IST) module. At least one of the SOC components includes a controller that communicates with the external interface. At least one of the plurality of SOC components communicates with the controller and at least one of the IST modules is a master IST module. The master IST module receives the test configuration data and that configures the IST modules for testing the plurality of SOC components.

In other features, the testing includes loopback testing. The loopback testing for at least one of the SOC components can include test loops having different paths.

In other features, the at least one of the IST modules includes a pattern generator that generates a predetermined pattern of test data. The at least one of the IST modules can further include a pattern comparator that receives test data from at least one of the plurality of SOC components and that compares the data to the predetermined pattern of test data.

In other features, at least one of the IST modules includes a solder joint testing module. The solder joint testing module can include a pulse generator that applies a predetermined pulse to a pin of the SOC and a receiver that receives a resultant waveform from the pin. The solder joint testing module can compare a parameter of the resultant waveform to at least one predetermined parameter.

In other features, the external interface can be of a type selected from a group consisting of integrated device electronics (IDE), fiber channel (FC), serial attached SCSI (SAS), secure digital input/output (SDIO), universal serial bus (USB), multimedia cards (MMC), high-speed multimedia cards (HS-MMC), advanced technology attachment (ATA), and serial Advanced Technology Attachment (SATA). A hard disk drive system can include the SOC.

In other features, an electronic system can include the SOC and a host that includes an IST module and a second external interface. The second external interface communicates the test configuration data with the external interface, and the master IST module further configures the IST module of the host for testing the plurality of SOC components together with said host.

A method is provided of making and testing a system on chip (SOC). The method includes providing an integrated system test (IST) module in each one of a plurality of SOC components, wherein at least one of the SOC components communicates with an external interface and at least one other of the SOC components. The method also includes receiving test configuration data, transmitting test result data, and transmitting and receiving application data via the external interface. The method further includes using at least one of the IST modules to receive the test configuration data and configure the IST modules to test the plurality of SOC components.

In other features, the testing includes loopback testing. The loopback testing for at least one of the SOC components can include test loops having different paths. The method can also include generating a predetermined pattern of test data at least one of the IST modules. The method can include receiving test data from at least one of the plurality of SOC components, and comparing the data to the predetermined pattern of test data.

In other features, at least one of the IST modules includes a solder joint testing module. The method can also include applying a predetermined pulse to a pin of the SOC, and receiving a resultant waveform from the pin. The method can include comparing a parameter of the resultant waveform to at least one predetermined parameter.

In other features, the method is extended to testing an electronic system and further includes providing a host that includes an IST module and a second external interface. The extended method also includes communicating the test configuration data between the external interface and the second external interface, and configuring the IST module of the host for testing the plurality of SOC components together with the host.

A system on chip (SOC) is provided that includes external interface means for receiving test configuration data, transmitting test result data, and transmitting and receiving application data. The SOC also includes a plurality of SOC components, each including integrated system test (IST) means for testing. At least one of the SOC components includes control means for communicating with the external interface means. At least one of the plurality of SOC components communicates with the control means. At least one of the IST means is master IST means for receiving the test configuration data and configuring the IST means to test the plurality of SOC components.

In other features, the testing includes loopback testing. The loopback testing for at least one of the SOC components can include test loops having different paths. At least one of the IST means can include pattern generating means for providing a predetermined pattern of test data. The at least one of the IST means can further include pattern comparing means for receiving test data from at least one of the plurality of SOC components and comparing the data to the predetermined pattern of test data.

In other features, at least one of the IST means includes solder joint testing means. The solder joint testing means can include pulse generating means for applying a predetermined pulse to a pin of the SOC and means for receiving a resultant waveform from the pin. The solder joint testing means can compare a parameter of the resultant waveform to at least one predetermined parameter.

In other features, the external interface means can be of a type selected from a group consisting of integrated device electronics (IDE), fiber channel (FC), serial attached SCSI (SAS), secure digital input/output (SDIO), universal serial bus (USB), multimedia cards (MMC), high-speed multimedia cards (HS-MMC), advanced technology attachment (ATA), and serial Advanced Technology Attachment (SATA). A hard disk drive means can include the SOC.

In other features, an electronic system is provided that includes the SOC and a host. The host includes IST means for testing and second external interface means for communicating the test configuration data with the external interface means. The master IST means further configures the IST means of the host for testing the plurality of SOC components together with the host.

A system is provided that includes a printed circuit board (PCB) that has at least one chip mounted thereon. A system on chip (SOC) is mounted on the PCB and includes a controller that communicates with an external interface that receives test configuration data, that transmits test result data, and that transmits and receives application data. The SOC includes an SOC component that includes an integrated system test (IST) module and the at least one chip includes a chip component that includes an integrated system test (IST) module. The at least one of the SOC component and the chip component communicates with the controller and at least one of the IST modules is a master IST module that receives the test configuration data and that configures the IST modules for testing at least one of the SOC component and the chip component.

In other features, the testing includes loopback testing. The loopback testing for at least one of the SOC components can include test loops having different paths.

In other features, at least one of the IST modules includes a pattern generator that generates a predetermined pattern of test data. The at least one of the IST modules can further include a pattern comparator that receives test data from at least one of the plurality of SOC components and compares the data to the predetermined pattern of test data.

In other features, at least one of the IST modules includes a solder joint testing module. The solder joint testing module can include a pulse generator that applies a predetermined pulse to a pin of the SOC and a receiver that receives a resultant waveform from the pin. The solder joint testing module can compare a parameter of the resultant waveform to at least one predetermined parameter.

In other features, the external interface can be of a type selected from a group consisting of integrated device electronics (IDE), fiber channel (FC), serial attached SCSI (SAS), secure digital input/output (SDIO), universal serial bus (USB), multimedia cards (MMC), high-speed multimedia cards (HS-MMC), advanced technology attachment (ATA), and serial Advanced Technology Attachment (SATA). A hard disk drive system can include the system.

A method of making and testing an electronic system is provided that includes providing a printed circuit board (PCB) and mounting a system on chip (SOC), comprising an integrated system test (IST) module, on the PCB. The method also includes mounting at least one chip, comprising a chip component that includes an integrated system test (IST) module, on the PCB. The method further includes communicating with an external interface that receives test configuration data, that transmits test result data, and that transmits and receives application data. The method also includes using at least one of the IST modules to receive the test configuration data and configure the IST modules to test at least one of the SOC component and the chip component.

In other features, the test includes a loopback test. The loopback test for at least one of the at least one of the SOC component and the chip component includes test loops can have different paths. The method can include generating a predetermined pattern of test data at at least one of the IST modules. The method can also include receiving test data from at least one of the plurality of SOC components and comparing the data to the predetermined pattern of test data.

In other features, the method further includes applying a predetermined pulse to a pin of the SOC, and receiving a resultant waveform from the pin. The method can also include comparing a parameter of the resultant waveform to at least one predetermined parameter.

In other features, the external interface is of a type selected from a group consisting of integrated device electronics (IDE), fiber channel (FC), serial attached SCSI (SAS), secure digital input/output (SDIO), universal serial bus (USB), multimedia cards (MMC), high-speed multimedia cards (HS-MMC), advanced technology attachment (ATA), and serial Advanced Technology Attachment (SATA). A hard disk drive system can execute the method.

A system is provided that includes printed circuit board (PCB) means for mounting and making connections between chips. A system on chip (SOC) is mounted on the PCB means and includes control means for communicating with external interface means for receiving test configuration data, transmitting test result data, and transmitting and receiving application data. At least one chip is mounted to the PCB means. The SOC comprises an SOC component that includes integrated system test (IST) means for testing. The at least one chip comprises a chip component that includes integrated system test (IST) means for testing. At least one of the SOC component and the chip component communicates with the control means. At least one of the IST means is a master IST means for receiving the test configuration data and configuring the IST means to test at least one of the SOC component and the chip component.

In other features, the testing includes loopback testing. The loopback testing for at least one of the SOC component and the chip component can include test loops having different paths. At least one of the IST means can include pattern generating means for generating a predetermined pattern of test data. The at least one of the IST means can further include means for receiving test data from at least one of the SOC component and the chip component and comparing the data to the predetermined pattern of test data.

In other features, at least one of the IST means includes solder joint testing means for testing a solder joint of said SOC. The solder joint testing means can include a pulse generating means for applying a predetermined pulse to a pin of the SOC and receiving a resultant waveform from the pin. The solder joint testing means can compare a parameter of the resultant waveform to at least one predetermined parameter.

In other features, the external interface means is of a type selected from a group consisting of integrated device electronics (IDE), fiber channel (FC), serial attached SCSI (SAS), secure digital input/output (SDIO), universal serial bus (USB), multimedia cards (MMC), high-speed multimedia cards (HS-MMC), advanced technology attachment (ATA), and serial Advanced Technology Attachment (SATA). A hard disk drive system can include the system.

A hard disk drive system comprises N hard disk drive components that are connected in a daisy-chain, wherein N is greater than one. An integrated system test (IST) module is integrated with a first one of the N hard disk drive components and includes a pattern generator and a pattern comparator. The pattern generator generates test data that is routed from the first one of the N hard disk drive components serially through the remaining ones of the N hard disk drive components and back to the first one of the N components. The pattern comparator generates test result data based on returned test data.

In other features, an external interface communicates with the first one of the N hard disk drive components, receives test configuration data for the IST module, transmits the test result data, and transmits and receives application data. At least one of the N hard disk drive components is selected from a group consisting of a controller, a system on chip (SOC), a read/write channel, a memory module, and a spindle/voice coil motor driver module. The external interface is of a type selected from a group consisting of integrated device electronics (IDE), fiber channel (FC), serial attached SCSI (SAS), secure digital input/output (SDIO), universal serial bus (USB), multimedia cards (MMC), high-speed multimedia cards (HS-MMC), advanced technology attachment (ATA), and serial Advanced Technology Attachment (SATA). The SOC, the memory module, and the spindle/voice coil motor driver module are mounted on a PCB. The pattern comparator compares the returned test data to predetermined return test data.

A method for testing components of a hard disk drive system includes connecting N hard disk drive components in a daisy-chain, wherein N is greater than one. The method also includes integrating an integrated system test (IST) module with a first one of said N hard disk drive components. The method also includes generating a test pattern and routing said test pattern from said first one of said N hard disk drive components serially through remaining ones of said N hard disk drive components and back to said first one of said N hard disk drive components. The method further includes generating test result data based on returned test data.

In other features, the method includes receiving test configuration data for said IST module, transmitting said test result data, and transmitting and receiving application data. The method can further include selecting at least one of said N hard disk drive components from a group consisting of a controller, a system on chip (SOC), a read/write channel, a memory module, and a spindle/voice coil motor driver module. The method can also include comparing said returned test data to predetermined return test data.

A hard disk drive system comprises N hard disk drive means for performing hard disk drive functions and that are connected in a daisy-chain, wherein N is greater than one. Integrated system test (IST) means for testing and that is integrated with a first one of the N hard disk drive means and includes pattern generating means for generating test pattern data and pattern monitoring means for receiving a returned test pattern. The test pattern data is routed from the first one of the N hard disk drive means serially through the remaining ones of the N hard disk drive means and back to the first one of the N hard disk drive means. The pattern monitoring means generates test result data based on returned test data.

In other features, external interface means communicates with the first one of the N hard disk drive means, receives test configuration data for the IST module, transmits the test result data, and transmits and receives application data. At least one of the N hard disk drive means is selected from a group consisting of a controller, a system on chip (SOC), a read/write channel, a memory module, and a spindle/voice coil motor driver module. The external interface means is of a type selected from a group consisting of integrated device electronics (IDE), fiber channel (FC), serial attached SCSI (SAS), secure digital input/output (SDIO), universal serial bus (USB), multimedia cards (MMC), high-speed multimedia cards (HS-MMC), advanced technology attachment (ATA), and serial Advanced Technology Attachment (SATA). The SOC, the memory module, and the spindle/voice coil motor driver module are mounted on the PCB. The pattern monitoring means compares the returned test data to predetermined return test data.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
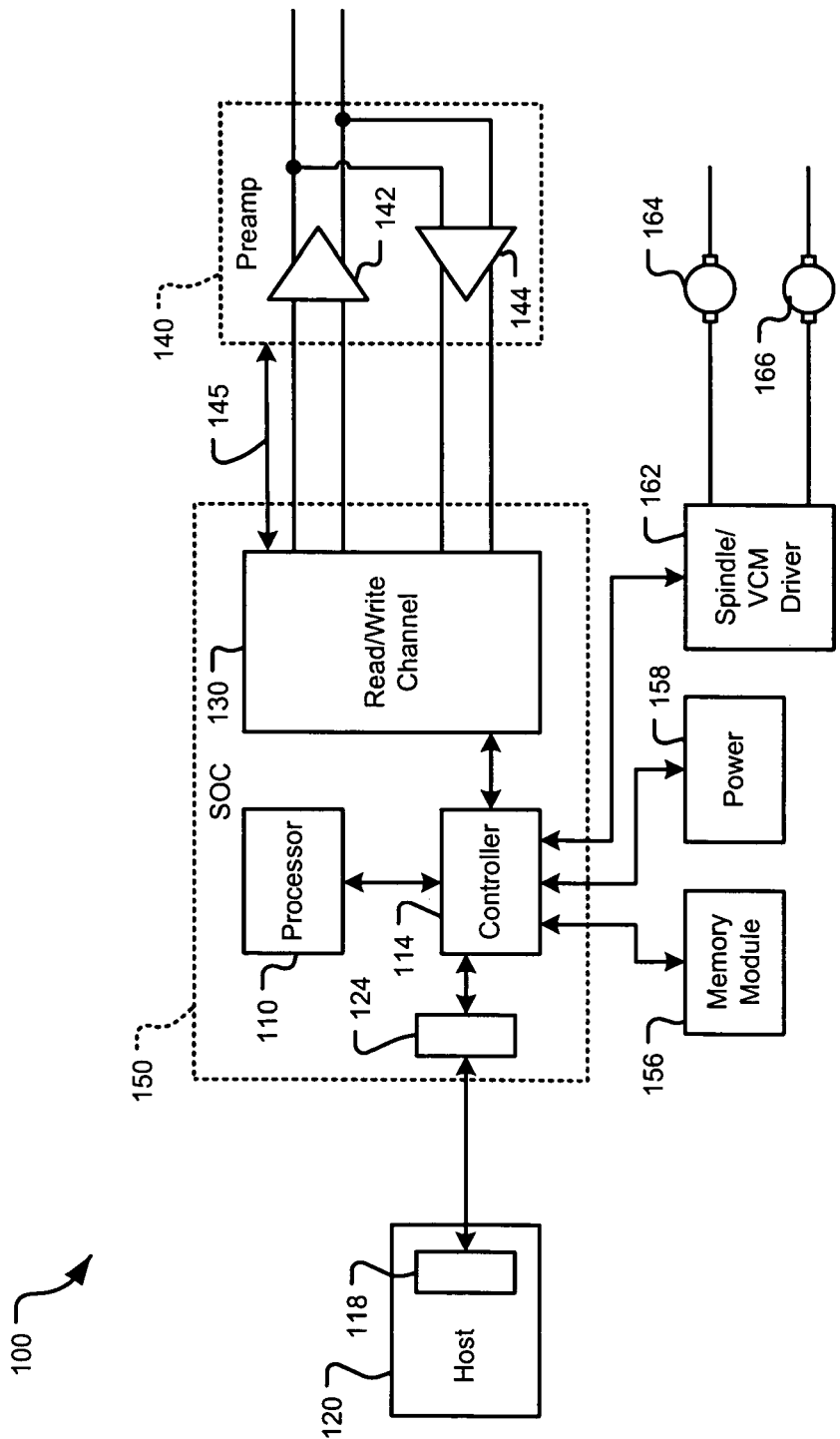
FIG. 1 is a functional block diagram of an exemplary hard disk drive system.

The following description of the preferred embodiment(s) is merely exemplary in nature and is in no way intended to limit the invention, its application, or uses. For purposes of clarity, the same reference numbers will be used in the drawings to identify similar elements. As used herein, the term module refers to an application specific integrated circuit (ASIC), an electronic circuit, a processor (shared, dedicated, or group) and memory that execute one or more software or firmware programs, a combinational logic circuit, and/or other suitable components that provide the described functionality.

Referring now to FIG. 1, a hard disk drive system 100 is shown to include a processor 110 that performs data and/or control processing. The processor 110 executes instructions that are stored in a boot ROM 108. The processor 112 can also include an analog-to-digital converter 112. A controller 114 transmits and receives application data with an interface 118 of a host device 120 via an interface 124. The interface 124 can be a standard type established by industry. By way of non-limiting example, these types include serializing/deserializing (SERDES) types such as serial advanced technology attachment (SATA), integrated device electronics (IDE), fiber channel (FC), serial attached SCSI (SAS), secure digital input/output (SDIO), universal serial bus (USB), multimedia cards (MMC), high-speed multimedia cards (HS-MMC), advanced technology attachment (ATA), or other interface. The controller 114 also transmits and receives data, write data and control data to a read/write channel 130. The read/write channel sends write data to and receives read data from a preamplifier 140 that includes one or more write amplifiers 142 and one or more read amplifiers 144. One or more control signal lines 145 connect the read/write channel 130 to the preamplifier 140 in addition to differential read and write channels. In some implementations, the processor 110, the controller 114 and the read/write channel 130 are implemented as a system on chip (SOC) 150.

The SOC 150 is attached to a printed circuit board (PCB) 154. A memory module 156 is used to buffer data during operation, store control data, etc. A power circuit 158, which may be an integrated circuit, controls the supply of power to other components of the hard disk drive system 100. A spindle/voice coil motor (VCM) driver 162, which may be part of an integrated circuit, receives control signals from the controller 114 and outputs drive signals to a voice coil motor (VCM) 164 and/or a spindle motor 166. One or more decoupling capacitors may be connected to components of the HDD system 100.

Figure 2:
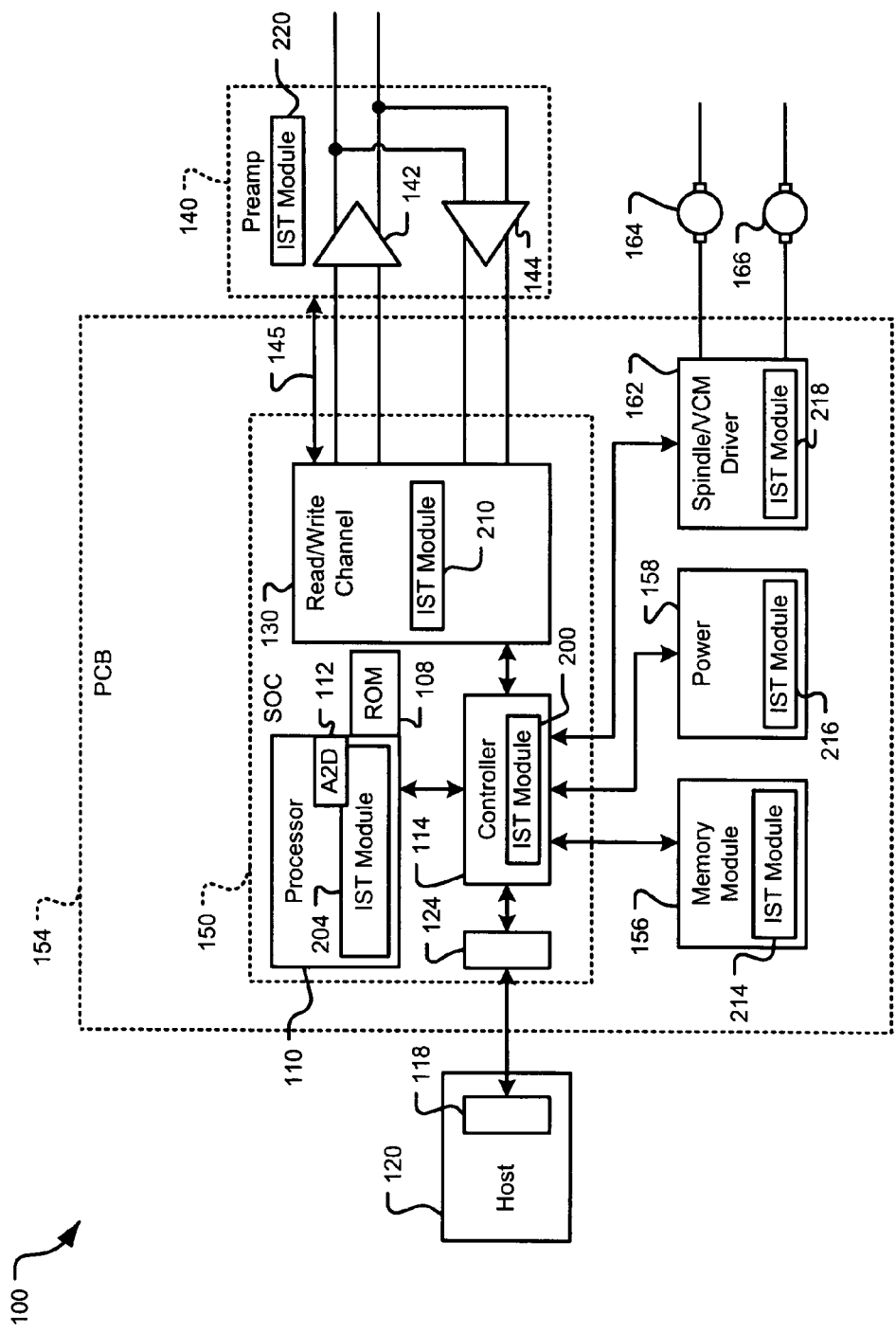
FIG. 2 is a functional block diagram of an exemplary hard disk drive system according to some implementations of the present invention.

Referring now to FIG. 2, the HDD system 100 of FIG. 1 is shown in further detail. Components of the HDD system 100 are shown to include integrated system testing (IST) modules. Depending upon the configuration and/or interconnection of components within the HDD system and/or the type of testing that is desired, some of the components may include master components and/or slave components.

For example, the controller 114 in FIG. 2 is designated a master test component and includes a master IST module 200. Since the controller 114 is connected to all of the remaining components of the HDD system 100, the remaining components include slave IST modules. In particular, the processor 110 includes a slave IST module 204, the read/write channel 130 includes a slave IST module 210, the memory 154 includes a slave IST module 214, the power circuit 158 includes a slave IST module 216, the spindle/VCM driver 162 includes a slave IST module 218 and the preamplifier 140 includes a slave IST module 220. Skilled artisans will appreciate, however, that there can be more than one master IST module in the system and/or each component may include one or more master and/or slave IST modules as needed. In some configurations, an IST module can be operated by the processor 110 as master using software in a boot ROM. Such an arrangement allows improved flexibility over a pure hardware arrangement to enhance an algorithm in the boot ROM.

Figure 3:
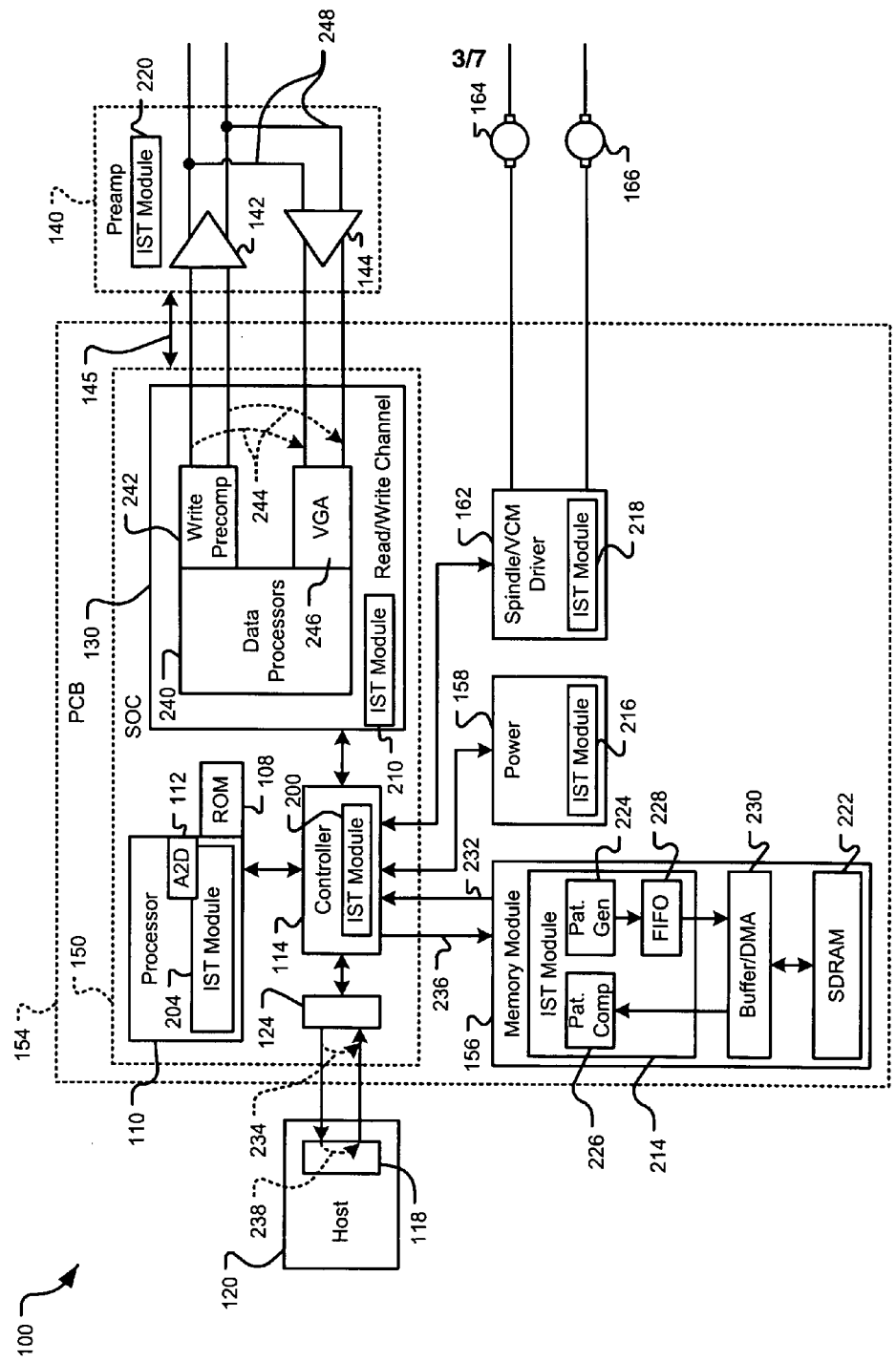
FIG. 3 is a functional block diagram of a hard disk drive system configured to execute various integrated tests.

Referring now to FIG. 3, the HDD system 100 is shown configured to execute several integrated system tests. The HDD system 100 receives test configuration instructions through the interface 124. The HDD system 100 also sends test results to the host 120 through the interface 124.

An integrated memory module test verifies that the memory module 156 is functional. The test configuration instructions configure the slave IST module 214 to enable a pattern generator 224 and a pattern comparator 226. The pattern generator 224 can be routed through a first-in first-out (FIFO) buffer 228 included in the slave IST module 214. The pattern generator 224 provides a predetermined bit pattern. A buffer/direct memory access module (DMA) 230 receives the predetermined bit pattern and writes it to an SDRAM 222. The buffer/DMA module 230 then reads data from the SDRAM 222 and provides the SDRAM data to the pattern comparator 226. The pattern comparator 226 compares the SDRAM data to the predetermined bit pattern originally provided by the pattern generator 224. The slave IST module 214 concludes that the memory module 156 is fully functional when the SDRAM data and the predetermined bit patterns are identical.

An interface/SDRAM test verifies that the interfaces 118 and 124 are able to communicate with the memory module 156. The test configuration instructions configure the slave IST module 214 to enable the pattern generator 224 and the pattern comparator 226. The pattern generator 224 communicates the predetermined bit pattern to the controller 114 over a communication path 232. The controller 114 forwards the predetermined bit pattern to the second interface 124. During a first section of the interface/SDRAM test, the test configuration instructions cause the interface 124 to enter a local loopback mode. A local loopback path 234 connects an output of the interface 124 to an input of the interface 124. The controller 114 reads a returning data pattern from the second interface 124 input and forwards it to the memory module 156 over a communication path 236. The pattern comparator 226 then compares the returning data pattern to the original predetermined bit pattern provided by the pattern generator 224. The slave IST module 214 concludes that the communication path between the interface 124 and the memory module 156 is fully functional when the SDRAM data and the predetermined bit patterns are identical. The master IST module 200 receives the test conclusion from the slave IST module 214 and forwards it to the host 120.

A second section of the interface/SDRAM test verifies the communication links between the first and second interface modules 118, 124. The test configuration instructions open the loop back path 234 and close a loopback path 238. The test configuration instructions configure the slave IST module 214 to enable the pattern generator 224 and the pattern comparator 226. The pattern generator 224 communicates the predetermined bit pattern to the controller 114 over the communication path 232. The controller 114 forwards the predetermined bit pattern to the first interface 118 via the second interface 124.

The loopback path 238 connects an output of the interface 118 to an input of the interface 118. The controller 114 reads a returning data pattern from the second interface 124 and forwards it to the memory module 156 over the communication path 236. The pattern comparator 226 then compares the returning data pattern to the original predetermined bit pattern provided by the pattern generator 224. The slave IST module 214 concludes that the communication links between the first and second interface modules 118, 124 are fully functional when the SDRAM data and the predetermined bit patterns are identical. The master IST module 200 receives the test conclusion from the slave IST module 214 and forwards it to the host 120.

A read/write test verifies that the read/write channel 130 is able to communicate with the memory module 156. The test configuration instructions configure the slave IST module 214 to enable the pattern generator 224 and the pattern comparator 226. The test configuration instructions also configure the slave IST module 210 to provide a local loopback path 244 between a write precompensation (WP) module 242 and a variable gain amplifier (VGA) 246. The WP module 242 provides an analog write signal to be applied to the preamplifier 140. The VGA 246 receives an analog read signal from the preamplifier 140. Data processors 240 convert the analog signals used by the WP module 242 and the VGA 246, to digital signals used by the controller 114. During the read/write test, the pattern generator 224 provides the predetermined bit pattern to the controller 114 via the communication path 232.

The controller 114 forwards the predetermined bit pattern to the read/write channel 130. The data processor 240 converts the predetermined bit pattern to an analog signal and communicates it to the WP module 242. The local loopback path 244 communicates the analog signal to the VGA 246, bypassing the preamplifier 140. The data processor 240 then converts the analog signal back to digital data for communication to the controller 114.

The controller 114 forwards the digital data to the pattern comparator 226. The pattern comparator 226 compares the digital data to the original predetermined bit pattern provided by the pattern generator 224. The slave IST module 214 concludes that the communication paths between the memory module 156, controller 114 and the read/write channel 130 are intact when the digital data and the predetermined bit patterns are identical. The master IST module 200 receives the test conclusion from the slave IST module 214 and forwards it to the host 120.

A second section of the read/write test operates identical to a first section described above, except the test configuration instructions cause the read/write channel 130 and the preamplifier 140 to enter a remote loopback mode. The remote loopback mode opens the local loopback path 244 and uses an internal loopback path 248 of the preamplifier 140 to return the analog signal to the VGA 246.

A write test verifies that the write portion of the read/write channel 130 is able to receive data from the memory module 156. The test configuration instructions configure the slave IST module 214 to enable the pattern generator 224 and a pattern comparator in the slave IST module 210. During the write test, the pattern generator 224 provides the predetermined bit pattern to the controller 114 via the communication path 232. The controller 114 forwards the predetermined bit pattern to the read/write channel 130.

The data processor 240 converts the predetermined bit pattern to an analog signal and communicates it to the WP module 242. The slave IST module monitors and decodes the analog signal. The slave IST module 120 compares the decoded analog signal to the original predetermined bit pattern provided by the pattern generator 224. The slave IST module 210 concludes that the write portion of the communication path between the memory module 156, controller 114 and the read/write channel 130 is intact when the decoded analog signal and the predetermined bit patterns are identical. The master IST module 200 receives the test conclusion from the slave IST module 210 and forwards it to the host 120.

Figure 4B:
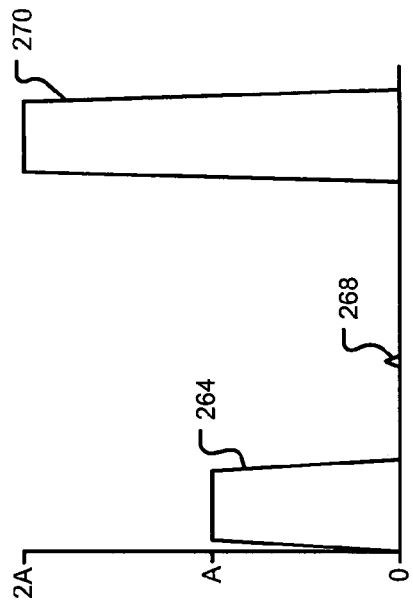
FIG. 4B is a signal diagram of solder joint testing module signals according to some implementations of the present invention.
Figure 4A:
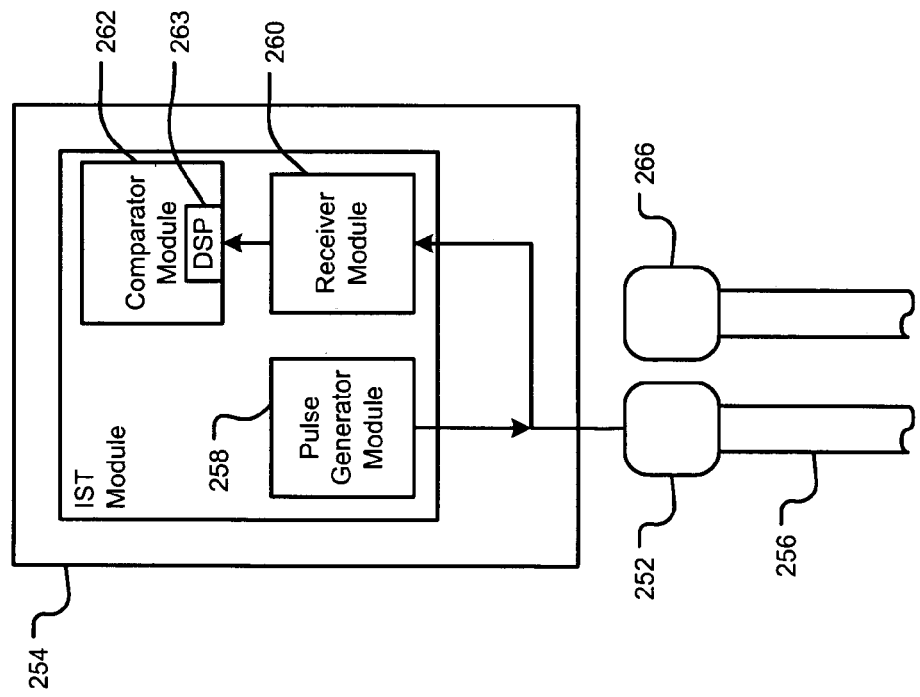
FIG. 4A is a signal diagram of a solder joint testing module according to some implementations of the present invention.

Referring now to FIG. 4A, a solder joint testing module 250 is shown. The solder joint testing module tests the integrity of a solder joint 252 between an integrated circuit 254 and an associated PCB trace 256. Each of the IST modules can include one or more solder joint testing modules 250. The test instructions can then individually configure each IST modules to test selected solder joints associated with a particular IST module and its solder joint testing modules 250. Each solder joint testing module 250 includes a pulse generator 258, a receiver 260, and a comparator 262. The receiver 260 can include the analog-to-digital converter 112, a peak-detect circuit, and/or other circuits.

Referring now to FIG. 4B, waveforms of the solder joint testing module 250 are shown. The pulse generator 258 applies a pulse 264 having a predetermined amplitude and width to the solder joint 252. The receiver 260 then monitors a resultant waveform produced by interference between the applied pulse 250 and a reflected waveform. If the solder joint 252 is short-circuited to an adjacent solder joint 266, the reflected waveform will destructively interfere with the applied waveform and the resultant waveform at the receiver 260 will appear similar to a waveform 268.

If the solder joint 252 is open, the reflected waveform will constructively interfere with the applied waveform, and the resultant waveform at the receiver 260 will appear similar to a waveform 270. The comparator 262 compares the resultant waveform to at least one predetermined parameter, such as amplitude, to determine whether the solder joint 252 is satisfactory. It should be appreciated that the shapes of the resultant waveforms 268 and 270 are examples only and the actual waveforms will be dependent on the waveform of the applied pulse 250, a distance between the pulse generator 258 and a defect that causes the reflected waveform, and a degree of the circuit failure (e.g. short circuit vs. lower than desired impedance and open circuit vs. higher than desired impedance, etc.). In some embodiments, the comparator 262 can improve an accuracy and/or repeatability of its determinations by including a digital signal processor (DSP) 263 that enhances the resultant waveforms 268, 270 prior to making the comparisons. The DSP 263 can apply complex digital signal processing to enhance testing for short/open, soft PCB trace, and/or solder connections.

Figure 5:
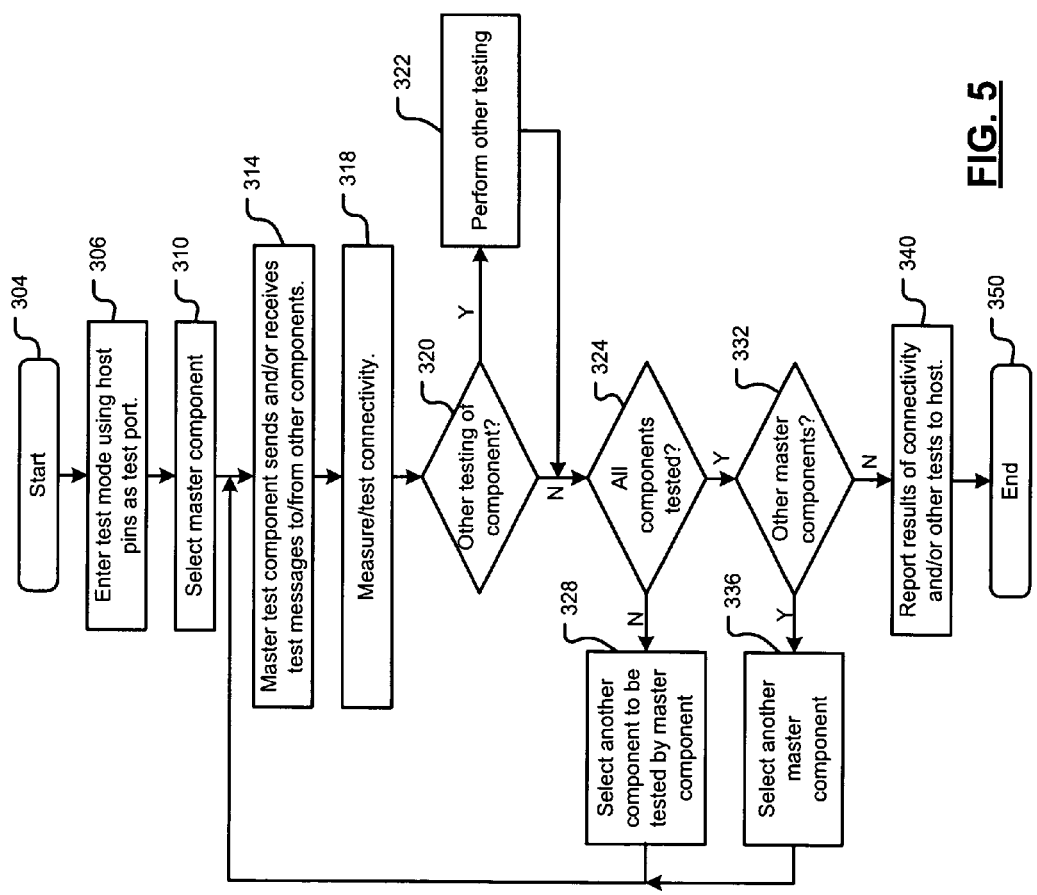
FIG. 5 is a flowchart illustrating steps that are performed by the HDD integrated testing system.

Referring now to FIG. 5, steps that are performed by the hard disk drive integrated systems testing are shown generally at 300. Control begins with steps 304. In step 306, a test mode is started using the host pins as a test port. In step 310, a master test component is selected. In step 314, the master test component sends and/or receives test messages to/from one or more slave test components in the hard disk drive system 100. In step 318, connectivity between the master test component and the one or more other components is measured and/or tested.

In step 320, control determines whether there are additional tests to be performed in addition to the connectivity test. In step 320 is true, additional testing is performed in step 322. Control continues with step 324 from step 320 (if step 320 is false) or from step 322. In step 324, control determines whether all of the slave test components associated with the master test component have been tested. If step 324 is false, control continues with step 328 and selects another component to be tested by the current master test component and control continues with step 314. If step 324 is true, control determines whether there are other master test components in the hard disk drive system 100. If step 332 is true, but other master test components is selected in step 336 and control continues with step 314. Otherwise, results of the connectivity and other tests are reported to the host device in step 340 and control ends in step 350.

Figure 6:
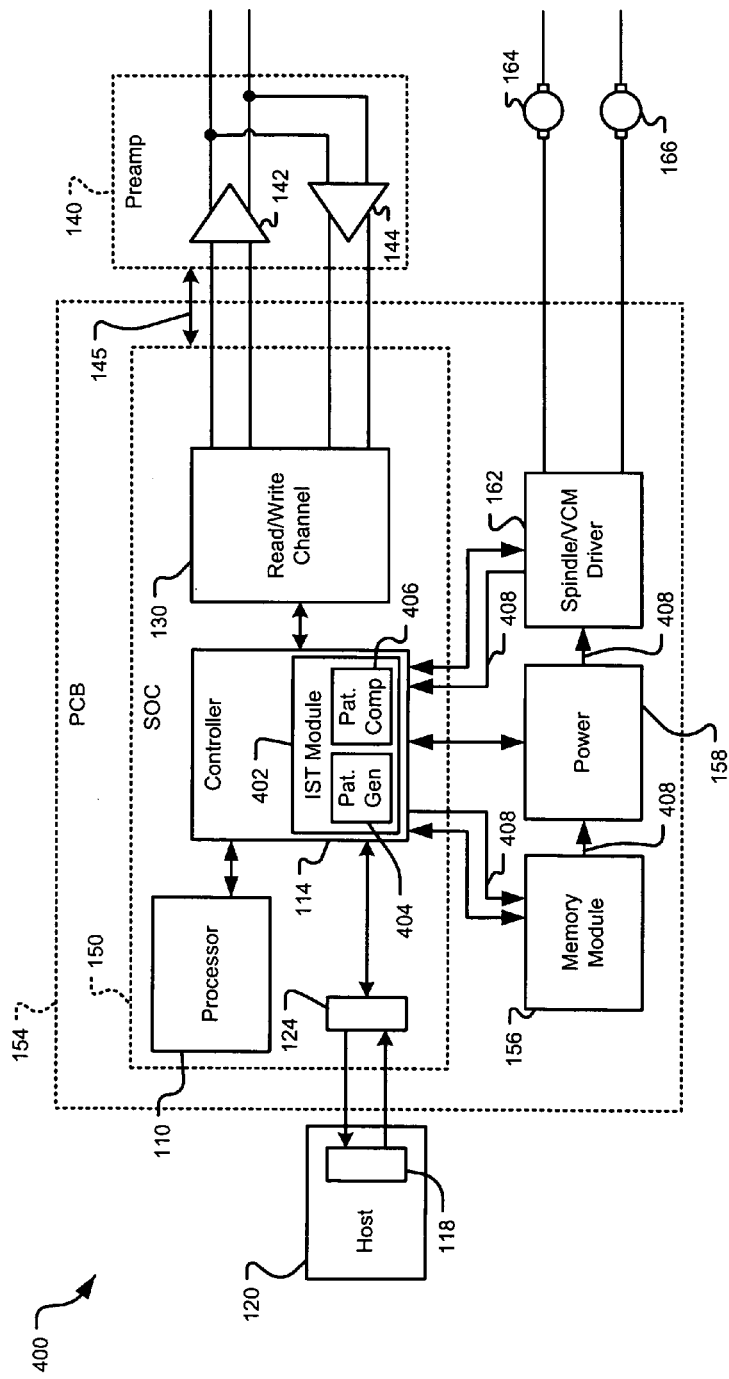
FIG. 6 is a functional block diagram of a hard disk drive system configured with a daisy-chain integrated test system.

Referring now to FIG. 6, an HDD system 400 is shown that includes the components of the HDD system of FIG. 1 connected in a daisy-chain configuration. In some implementations, the memory module 156, the power module 158, and the spindle/VCM driver module 162 are each implemented in a respective chip that is mounted to the PCB 154.

The controller 114 includes a master IST module 400. The master IST module 400 controls a pattern generator 404 and receives test results from a pattern comparator 406. A daisy-chain data path 408 serially links hard disk drive components or nodes. The nodes include the master IST module 400 in the controller 114, the memory module 156, the power module 158, and the spindle/VCM driver module 162. Test data is returned back to the controller 114.

During test operations, the master IST module 402 receives the test configuration instructions and causes the pattern generator 404 to generate the predetermined bit pattern. The pattern generator 404 communicates the predetermined bit pattern (with and/or without modification by each of the nodes) through the daisy-chain data path 408 to the memory module 156, the power module 158, and the spindle/VCM driver module 162 and returns test data back to the controller 114. The nodes selectively perform a respective internal test using the predetermined bit pattern and forward the respective test result via the daisy-chain data path 408 to the next node and/or back to the controller 114.

The pattern comparator 406 can read data from the daisy-chain data path 408 and determine whether the returned data meets the predetermined criteria, matches a predetermined bit pattern, and/or has a predetermined relationship with the predetermined bit pattern. The pattern comparator 406 determines that the daisy-chain data path 408 is functional when the returned data meets the predetermined criteria, matches and/or falls within the relationship. If not, the pattern comparator determines that one or more components in the daisy-chain are not functional. The master IST module communicates test result information to the host via the interface 124.

While the teachings of the present invention were described in the context of the hard disk drive systems 100 and 400, it should be appreciated by those skilled in the art that the present invention is also applicable to other systems.

Figure 7:
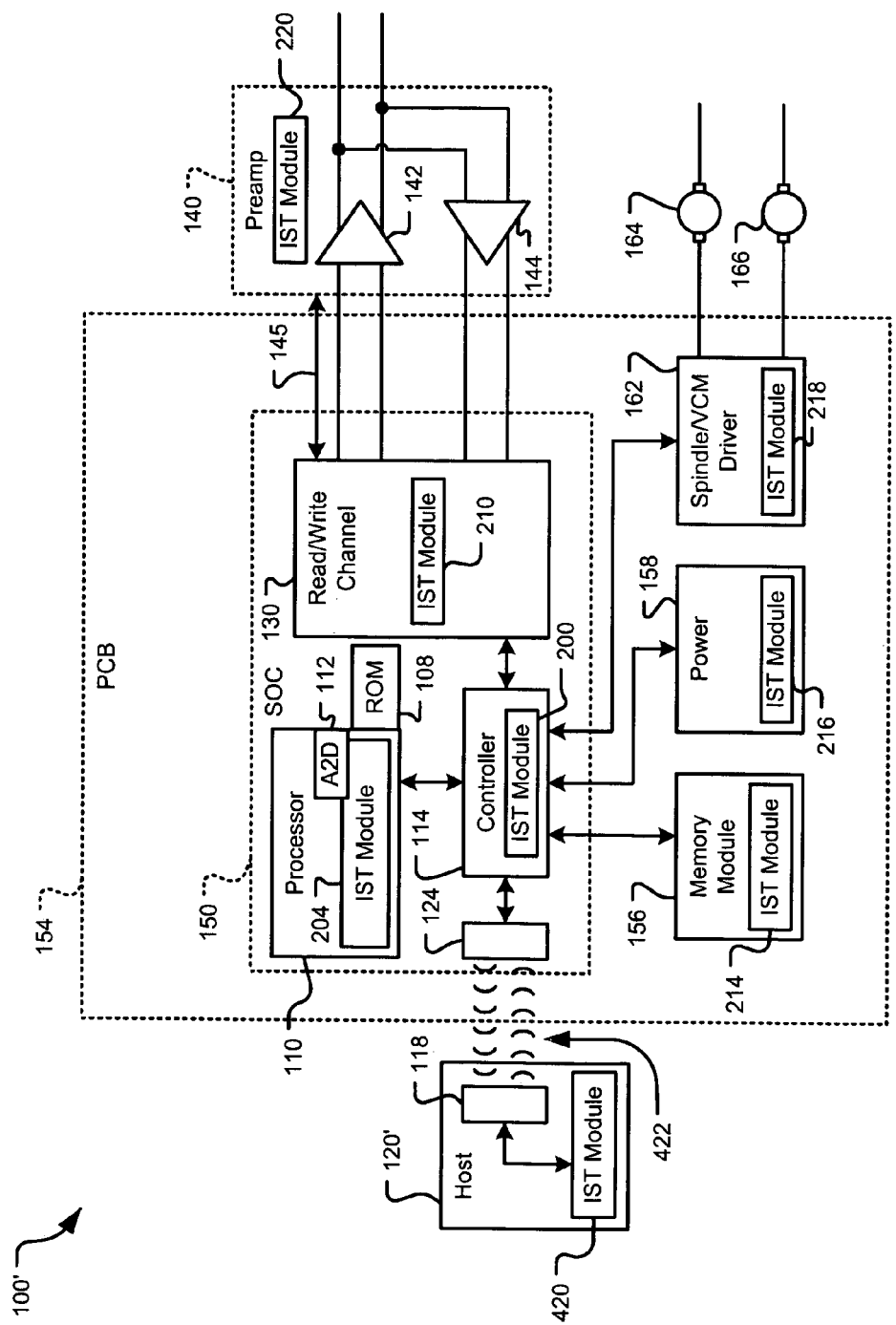
FIG. 7 is a functional block diagram of an exemplary wireless hard disk drive system according to some implementations of the present invention.

Referring now to FIG. 7, a functional block diagram is shown of a wireless hard disk drive system 100'. A host 120' includes an IST module 420 that communicates with the interface 118. The interfaces 118, 124 are of a wireless type, such as SDIO, and communicate over a wireless channel 422. The test configuration data can configure the IST module 420 to be included in tests of the SOC 150. By including the IST module 420 in the host 120', the hard disk drive system 100' includes integrated system test capability for the host 120', SOC 150, and/or the PCB 154.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A hard disk drive system comprises:
    N hard disk drive means for performing hard disk drive functions and that are connected in a daisy chain, wherein N is greater than one;
    integrated system test (IST) means for testing and that is integrated with a first one of the N hard disk drive means and includes:
    pattern generating means for generating test pattern data; and
    pattern monitoring means for receiving a returned test pattern,
    wherein the pattern generating means generates test pattern data that is routed from the first one of the N hard disk drive means serially through the remaining ones of the N hard disk drive means and back to the first one of the N hard disk drive means, and
    wherein the pattern monitoring means generates test result data based on returned test data returned to the first one of the N hard disk drive means.

2. The hard disk drive system of claim 1 further comprising external interface means for communicating with the first one of the N hard disk drive means, for receiving test configuration data, for transmitting the test result data, and for transmitting and receiving application data.

3. The hard disk drive of claim 1 wherein at least one of the N hard disk drive means is selected from a group consisting of a controller, a system on chip (SOC), a read/write channel, a memory module, and a spindle/voice coil motor driver module.

4. The hard disk drive system of claim 2 wherein the external interface means is of a type selected from a group consisting of integrated device electronics (IDE), fiber channel (FC), serial attached SCSI (SAS), secure digital input/output (SDIO), universal serial bus (USB), multimedia cards (MMC), high-speed multimedia cards (HS-MMC), advanced technology attachment (ATA), and Serial Advanced Technology Attachment (SATA).

5. The hard disk drive system of claim 1 further comprising a printed circuit board (PCB), wherein a system on chip (SOC), a memory module, and a spindle/voice coil motor driver module are mounted on the PCB.

6. The hard disk drive system of claim 1 wherein the pattern monitoring means compares the returned test data to a predetermined test pattern.

7. A hard disk drive system, comprising:
    N hard disk drive components that are connected in a daisy-chain, wherein N is greater than one; and
    an integrated system test (IST) module that is integrated with a first one of said N hard disk drive components and that interfaces with:
    a pattern generator; and
    a pattern comparator,
    wherein said pattern generator generates test data that is routed from said first one of said N hard disk drive components serially through remaining ones of said N hard disk drive components and back to said first one of said N components, and
    wherein said pattern comparator generates test result data based on returned test data.

8. The hard disk drive system of claim 7 further comprising an external interface that communicates with said first one of said N hard disk drive components, that receives test configuration data for said IST module, that transmits said test result data, and that transmits and receives application data.

9. The hard disk drive of claim 7 wherein at least one of said N hard disk drive components is selected from a group consisting of a controller, a system on chip (SOC), a read/write channel, a memory module, and a spindle/voice coil motor driver module.

10. The hard disk drive system of claim 8 wherein said external interface is of a type selected from a group consisting of integrated device electronics (IDE), fiber channel (FC), serial attached SCSI (SAS), secure digital input/output (SDIO), universal serial bus (USB), multimedia cards (MMC), high-speed multimedia cards (HS-MMC), advanced technology attachment (ATA), and Serial Advanced Technology Attachment (SATA).

11. The hard disk drive system of claim 7 further comprising a printed circuit board (PCB), wherein a system on chip (SOC), a memory module, and a spindle/voice coil motor driver module are mounted on said PCB.

12. The hard disk drive system of claim 7 wherein said pattern comparator compares said returned test data to predetermined return test data.

13. A method for testing components of a hard disk drive system, comprising:
connecting N hard disk drive components in a daisy-chain, wherein N is greater than one;
integrating an integrated system test (IST) module with a first one of said N hard disk drive components;
generating a test pattern;
routing said test pattern from said first one of said N hard disk drive components serially through remaining ones of said N hard disk drive components and back to said first one of said N hard disk drive components; and
generating test result data based on returned test data.

14. The method of claim 13 further comprising:
receiving test configuration data for said IST module;
transmitting said test result data; and
transmitting and receiving application data.

15. The method of claim 14 further comprising selecting at least one of said N hard disk drive components from a group consisting of a controller, a system on chip (SOC), a read/write channel, a memory module, and a spindle/voice coil motor driver module.

16. The method of claim 13 further comprising comparing said returned test data to predetermined return test data.

* * * * *

UNITED STATES PATENT AND TRADEMARK OFFICE
CERTIFICATE OF CORRECTION

PATENT NO.        : 7,439,729 B2
APPLICATION NO.   : 11/243660
DATED             : October 21, 2008
INVENTOR(S)       : Saeed Azimi et al.

Page 1 of 1

It is certified that error appears in the above-identified patent and that said Letters Patent is hereby corrected as shown below:

| | |
|---|---|
| Column 4, Line 42 | Insert -- at -- after "data" |
| Column 6, Line 23 | Delete second occurrence of "at least one of the" |
| Column 6, Line 24 | Insert -- that -- after "loops" |
| Column 12, Line 57 | Delete "in" and insert -- If -- |
| Column 12, Line 67 | Delete "is" and insert -- are -- |
| Column 12, Line 67 | Delete "and" and insert -- then -- |

Signed and Sealed this

Twenty-fourth Day of March, 2009

JOHN DOLL
*Acting Director of the United States Patent and Trademark Office*